(12) United States Patent  
Aota

(10) Patent No.: US 12,457,748 B2  
(45) Date of Patent: Oct. 28, 2025

(54) SEMICONDUCTOR DEVICE AND METHOD OF MANUFACTURING SEMICONDUCTOR DEVICE

(71) Applicant: KIOXIA CORPORATION, Tokyo (JP)

(72) Inventor: Shoji Aota, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 562 days.

(21) Appl. No.: 17/901,656

(22) Filed: Sep. 1, 2022

(65) Prior Publication Data

US 2023/0292520 A1    Sep. 14, 2023

(30) Foreign Application Priority Data

Mar. 10, 2022  (JP) .................................. 2022-037153

(51) Int. Cl.
| | |
|---|---|
| *H10B 43/40* | (2023.01) |
| *H01L 23/00* | (2006.01) |
| *H01L 25/065* | (2023.01) |
| *H01L 25/18* | (2023.01) |
| *H10B 41/40* | (2023.01) |

(52) U.S. Cl.
CPC ............. *H10B 43/40* (2023.02); *H01L 24/08* (2013.01); *H01L 25/0657* (2013.01); *H01L 25/18* (2013.01); *H10B 41/40* (2023.02); *H01L 2224/08145* (2013.01); *H01L 2924/1431* (2013.01); *H01L 2924/14511* (2013.01)

(58) Field of Classification Search
CPC ......... H10B 41/40; H10B 43/40; H01L 24/08; H01L 25/0657; H01L 25/18; H01L 2224/08145; H01L 2924/1431; H01L 2924/14511

See application file for complete search history.

(56) References Cited

U.S. PATENT DOCUMENTS

| | | | |
|---|---|---|---|
| 6,197,645 B1* | 3/2001 | Michael ............... | H10D 64/518 |
| | | | 438/300 |
| 6,251,729 B1* | 6/2001 | Montree ............... | H10B 41/46 |
| | | | 438/257 |
| 2007/0215918 A1* | 9/2007 | Ito ....................... | H10D 64/021 |
| | | | 257/E21.639 |
| 2018/0090511 A1 | 3/2018 | Nakajima | |

FOREIGN PATENT DOCUMENTS

JP        2018049968 A      3/2018

* cited by examiner

*Primary Examiner* — Brook Kebede  
(74) *Attorney, Agent, or Firm* — Kim & Stewart LLP

(57) ABSTRACT

According to one embodiment, a semiconductor device includes a substrate, a first transistor, a second transistor, a first insulating portion, and a second insulating portion. The first transistor includes a first diffusion region and a second diffusion region, a first gate insulating film, and a first gate electrode. The second transistor includes a third diffusion region and a fourth diffusion region, a second gate insulating film, and a second gate electrode. The first insulating portion is positioned between the first gate electrode and the second gate electrode. The second insulating portion covers the first transistor, the second transistor, and the first insulating portion from a side opposite to the substrate. The first insulating portion and the second insulating portion are formed of different materials.

17 Claims, 12 Drawing Sheets

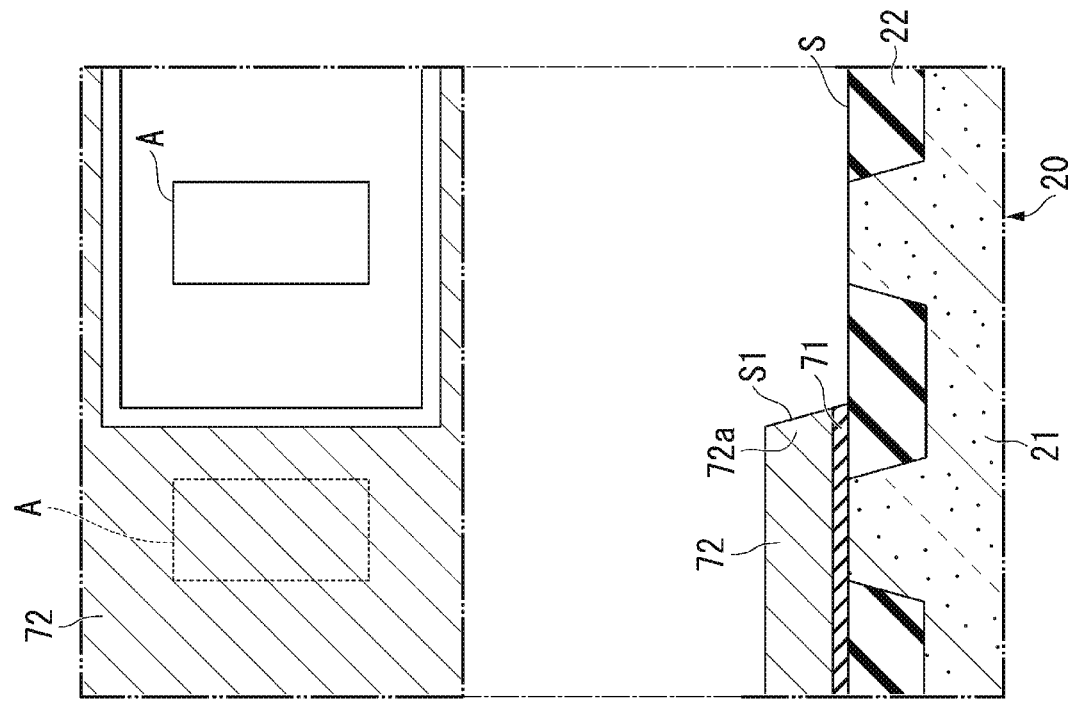
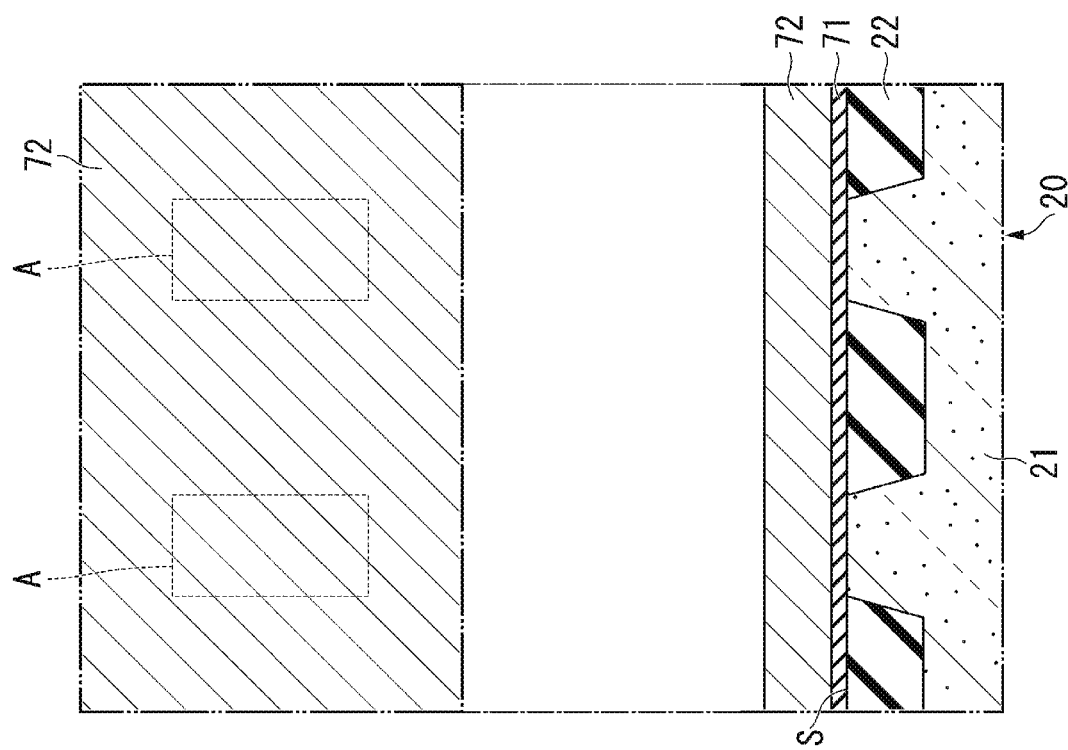

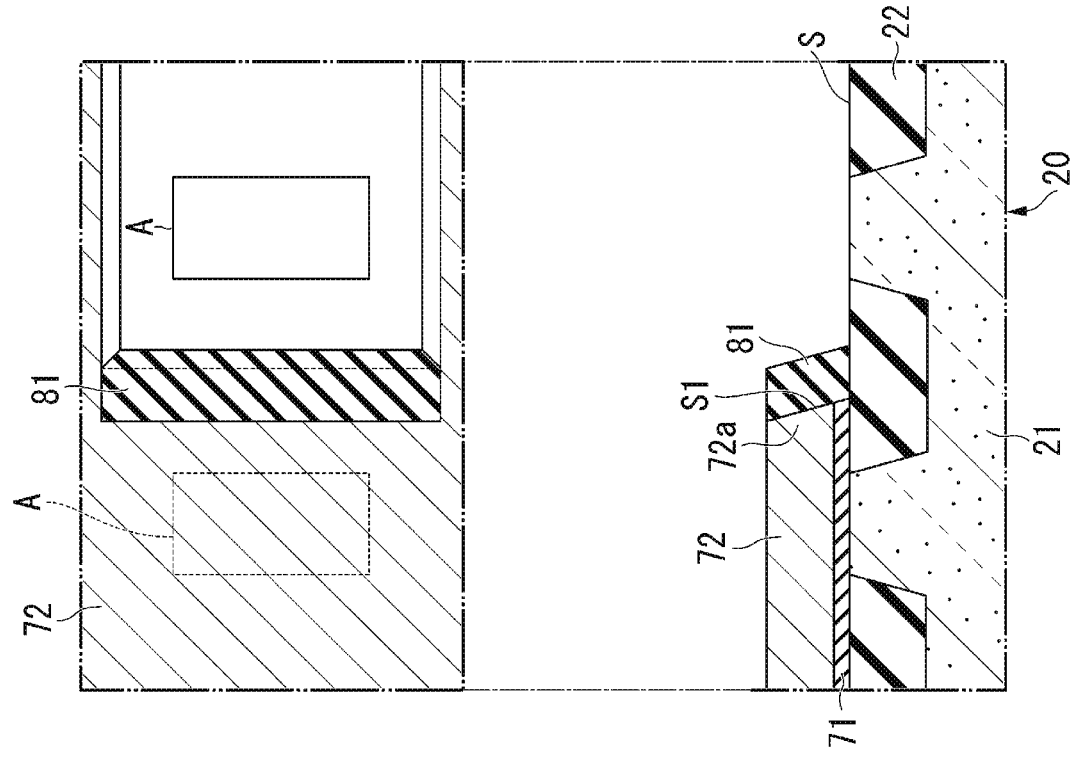

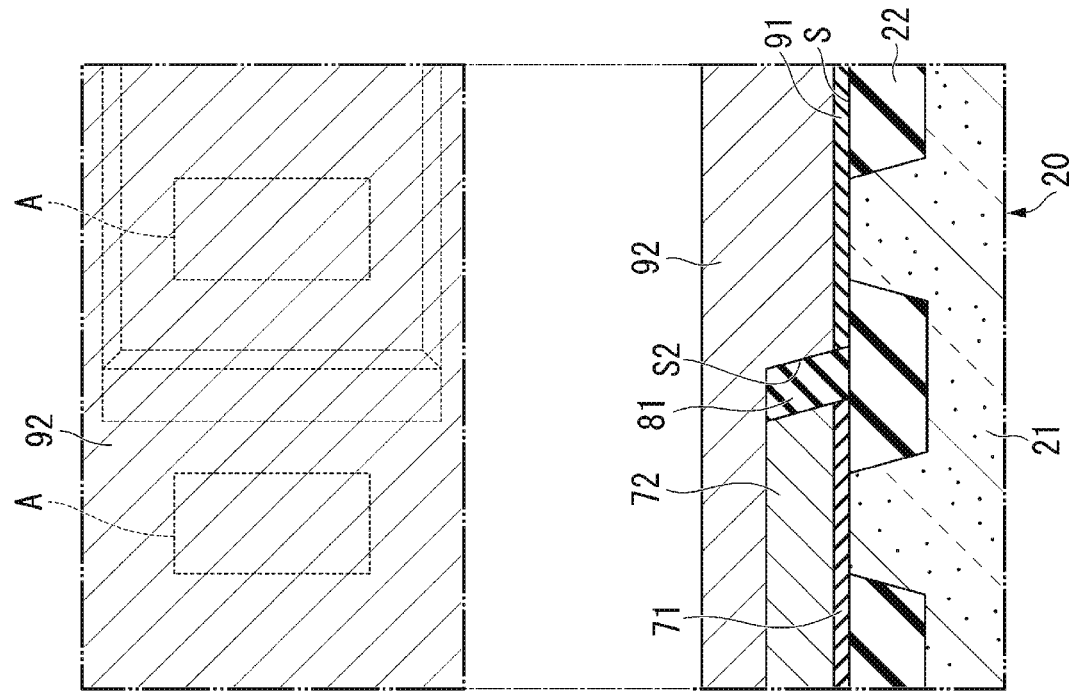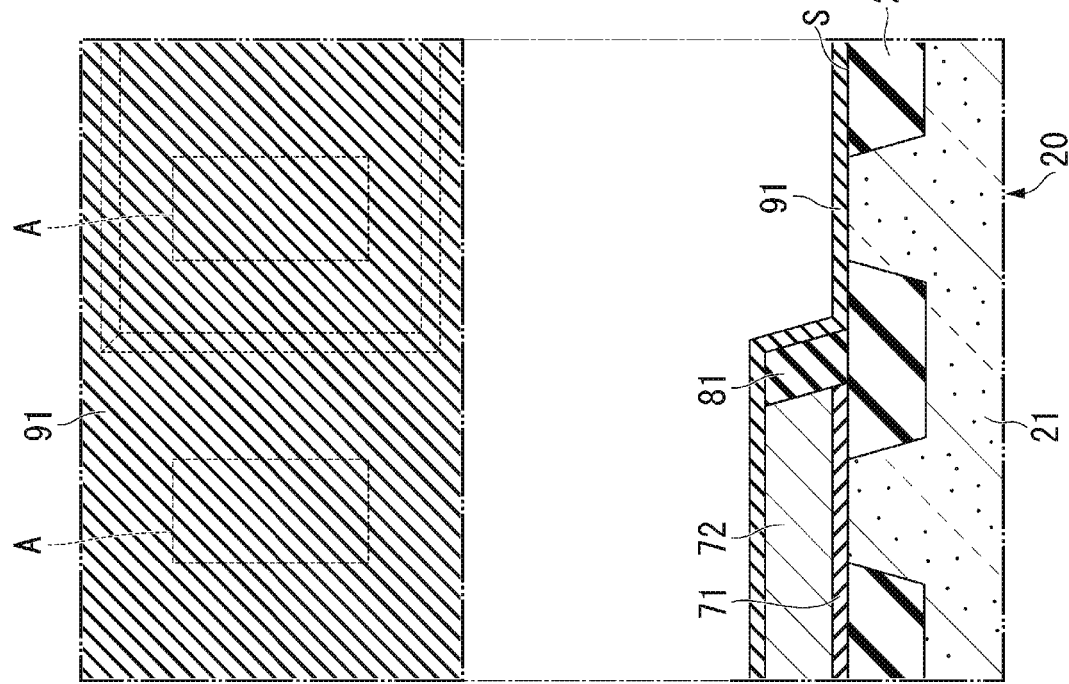

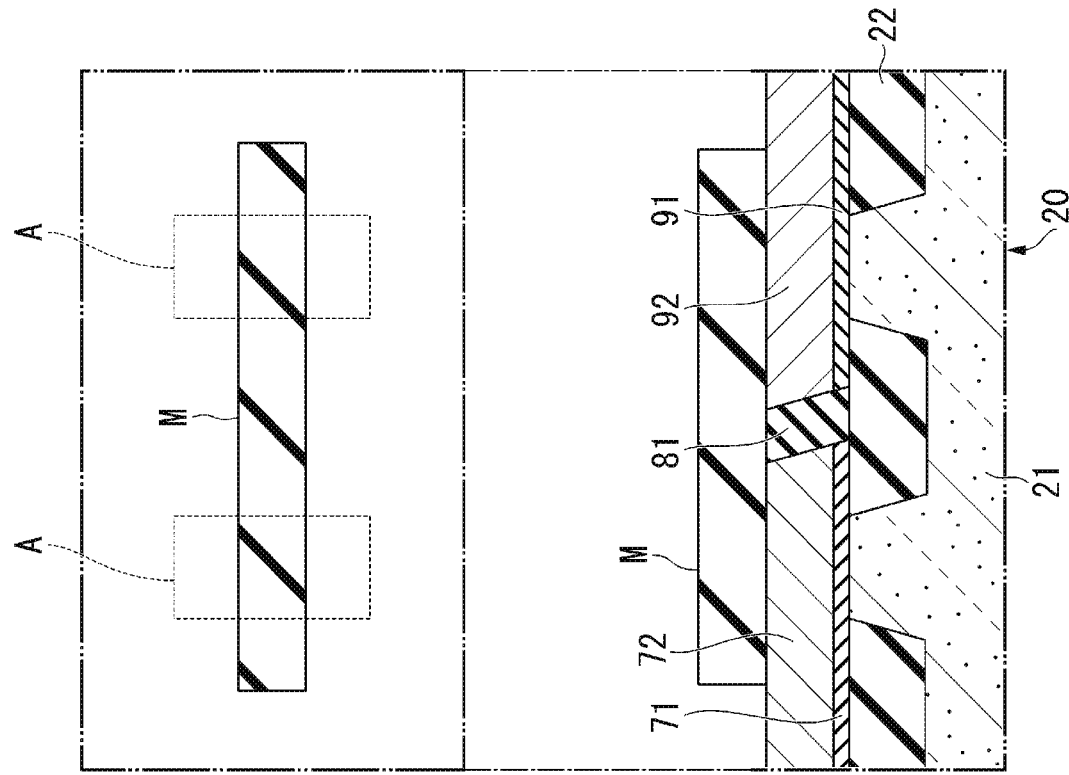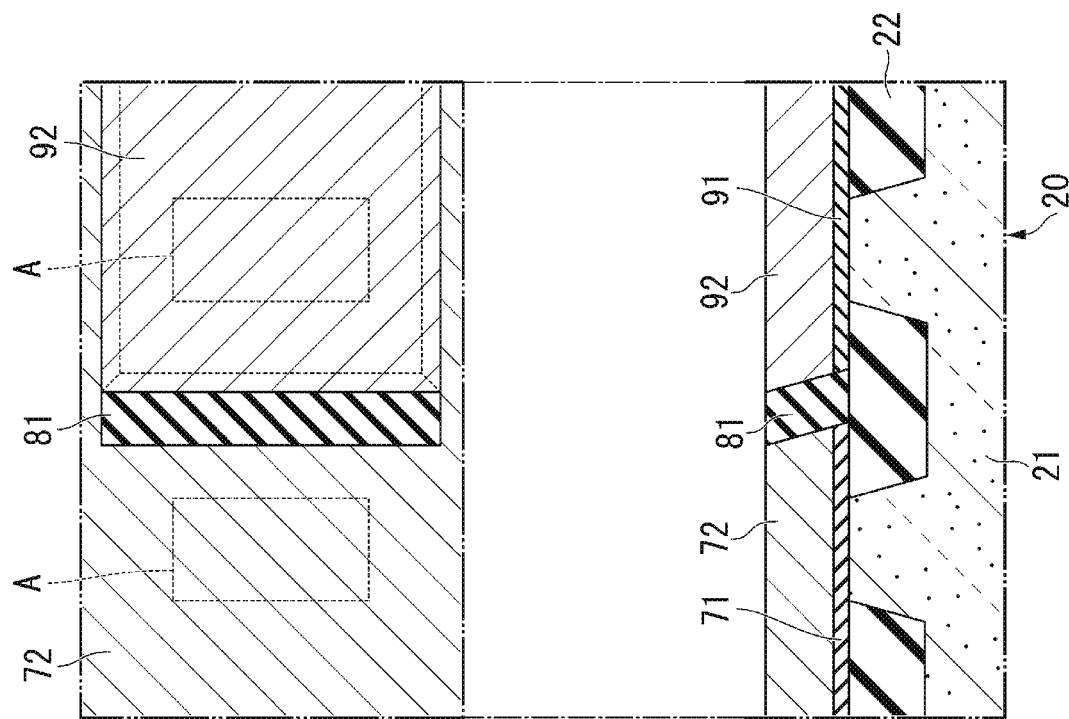

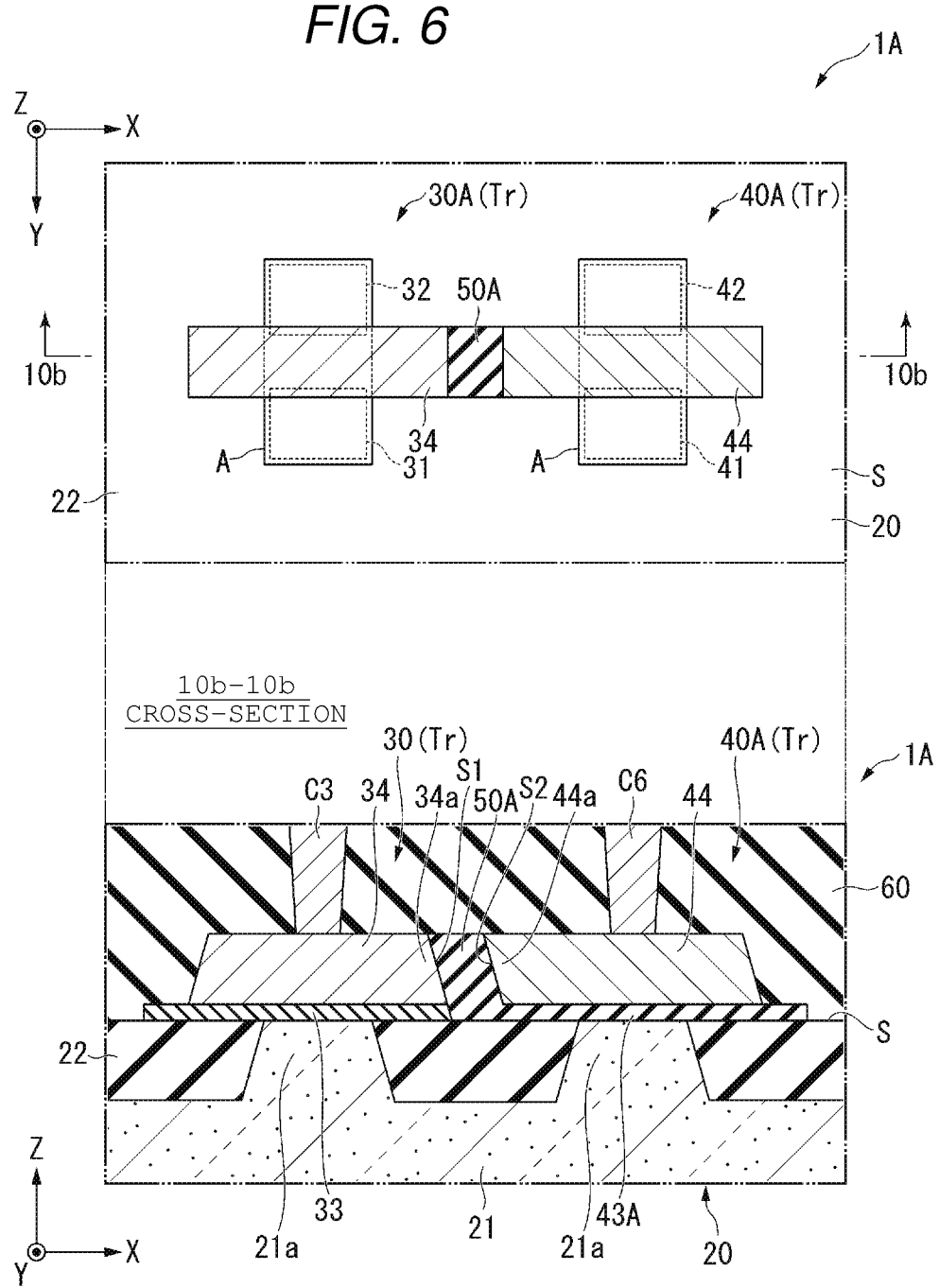

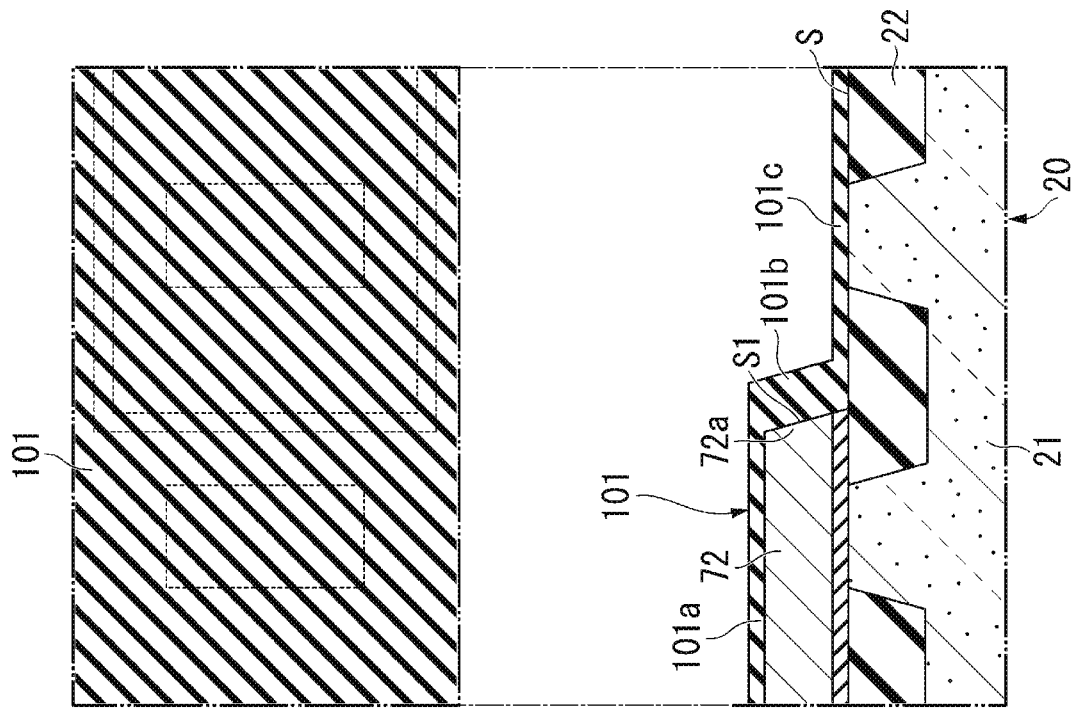
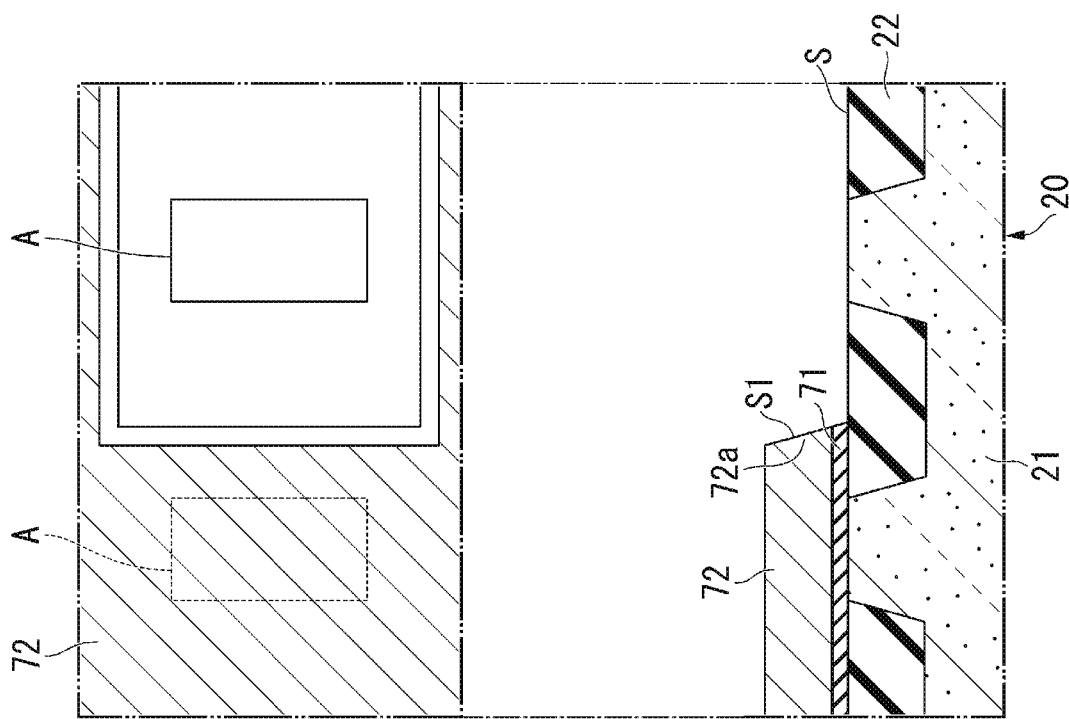

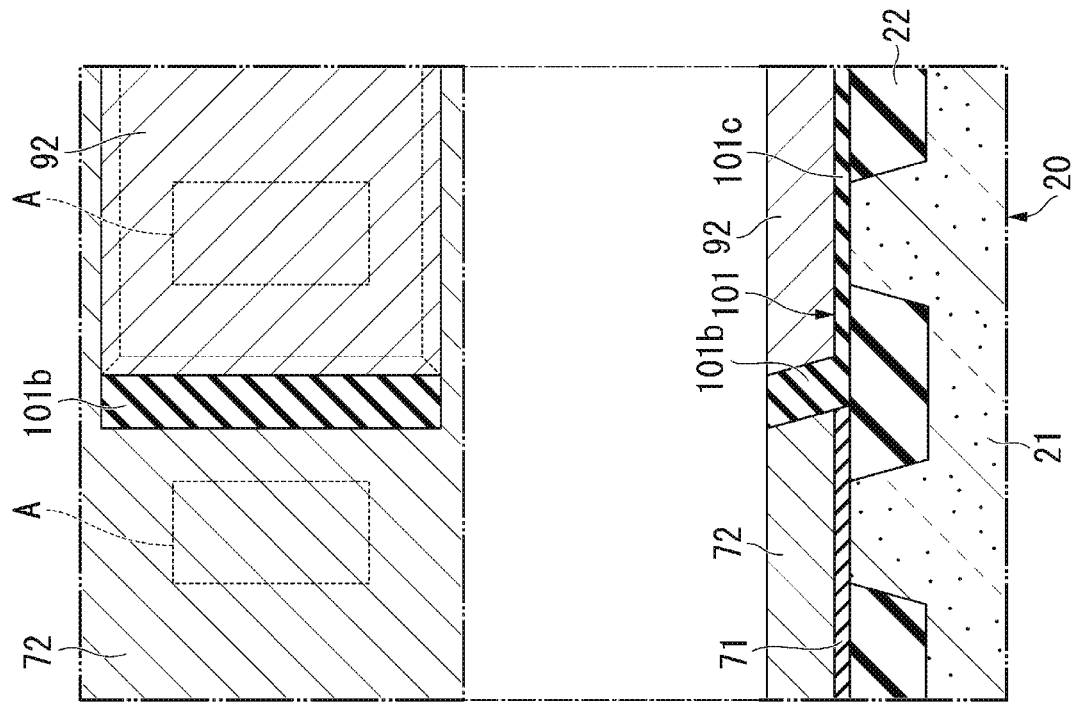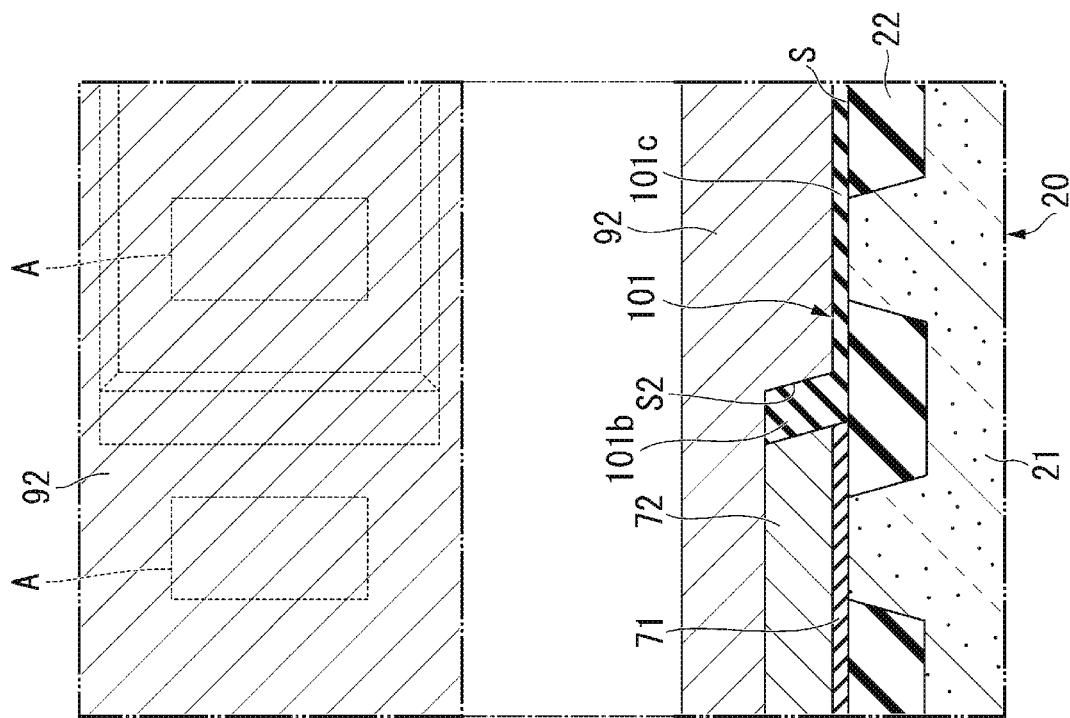

SEMICONDUCTOR DEVICE AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2022-037153, filed Mar. 10, 2022, the entire contents of which are incorporated herein by reference.

FIELD

Embodiments described herein relate generally to a semiconductor device and a method of manufacturing a semiconductor device.

BACKGROUND

A semiconductor device including a semiconductor substrate and a transistor provided in the semiconductor substrate is known.

BRIEF DESCRIPTION OF THE DRAWINGS

FIGS. 5A to 5I are diagrams illustrating a method of manufacturing a semiconductor device according to a first embodiment.

FIG. 6 illustrates a semiconductor substrate and two transistors in a second embodiment.

FIGS. 7A to 7D are diagrams illustrating a method of manufacturing a semiconductor device according to a second embodiment.

DETAILED DESCRIPTION

Figure 1:
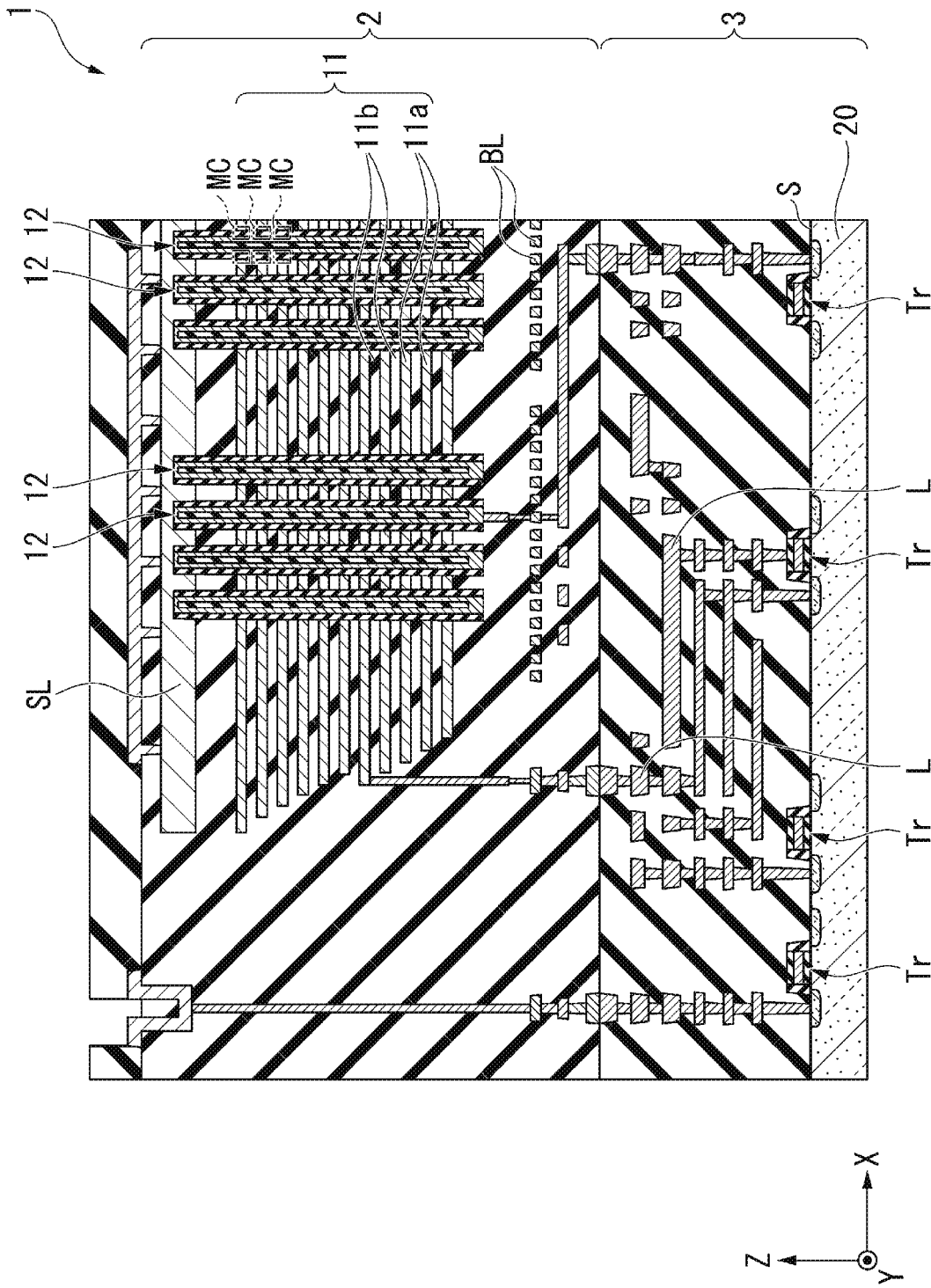
FIG. 1 is a cross-sectional view of a semiconductor device according to a first embodiment.

Embodiments provide a semiconductor device that can have an improved degree of integration and a method of manufacturing such a semiconductor device.

In general, according to one embodiment, a semiconductor device includes a first transistor having a first diffusion region and a second diffusion region in a substrate, a first gate insulating film on a first channel region between the first diffusion region and the second diffusion region, and a first gate electrode on the first gate insulating film; and a second transistor adjacent to the first transistor and having a third diffusion region and a fourth diffusion region in the substrate, a second gate insulating film on a second channel region between the third diffusion region and the fourth diffusion region, and a second gate electrode on the second gate insulating film. A first insulating portion is between the first gate electrode and the second gate electrode. A second insulating portion covers the first transistor, the second transistor, and the first insulating portion. The first insulating portion and the second insulating portion are different materials.

Hereinafter, semiconductor devices according to certain example embodiments and methods related to manufacturing such semiconductor devices will be described with reference to the drawings. In the following description, components having the same or equivalent function are represented by the same reference numeral. Repeated description of the components depicted in more than one drawing or found in more than one described example embodiment will generally be omitted. As used herein, terms such as "parallel", "perpendicular", or "the same" encompass "substantially parallel", "substantially perpendicular", or "substantially the same", unless otherwise noted. The meaning of "connection" may include both, or either, a mechanical/physical connection or electrical connection. That is, "connection" is not limited to a case where elements are directly connected to each other and may include a case where elements are connected to one another by another element interposed therebetween. The term "facing" refers to two members that overlap each other when seen in one direction and may include a case where another member is present between the two members.

For descriptive purposes, an X direction, a Y direction, and a Z direction are defined in the drawings. The X direction and the Y direction are directions along a surface S of a semiconductor substrate 20 (refer to FIG. 1). The X direction is a direction from a first transistor 30 to a second transistor 40 (refer to FIG. 2). The Y direction is a direction intersecting (for example, perpendicular to) the X direction. The Z direction is a direction intersecting (for example, perpendicular to) the X direction and the Y direction. The Z direction is a thickness direction of the semiconductor substrate 20 (refer to FIG. 1). In the following description, a side on which the first transistor 30 and the second transistor 40 are positioned with respect to the semiconductor substrate 20 may also be referred to as an "upper" side, and an opposite side thereof may also be referred to as a "lower" side. Here, these expressions are used for convenience of description and does not define the gravity direction.

First Embodiment

1. Configuration Example of Semiconductor Device

FIG. 1 is a cross-sectional view illustrating a configuration example of a semiconductor device 1 according to a first embodiment. The semiconductor device 1 is a semiconductor memory device such as a NAND flash memory. The semiconductor device 1 includes, for example, an array chip 2 and a circuit chip 3.

The array chip 2 is a memory chip or the like where information (data) can be stored. The array chip 2 includes, for example, a stacked body 11, a plurality of memory pillars 12, a source line SL, and a plurality of bit lines BL. The stacked body 11 includes a plurality of word lines 11a and a plurality of insulating layers 11b. The plurality of word lines 11a and the plurality of insulating layers 11b are alternately stacked one layer on another layer in the Z direction.

The memory pillars 12 extend in the Z direction in the stacked body 11. Each of the memory pillars 12 include an insulating portion, a channel layer, a tunnel insulating film, a charge storage unit, and a block insulating film from the center portion to the outer circumferential side of the memory pillar 12. One end portion (a first end) of each of the memory pillars 12 is connected to the source line SL. Another end portion (a second end opposite from the first)

of each of the memory pillars 12 is connected to a bit line BL. A memory cell transistor MC is formed at an intersection between the memory pillars 12 and each of the word lines 11a. The memory cell transistor MC is a memory element where information can be stored by storing charge.

The circuit chip 3 is a control circuit that controls an operation of the array chip 2. The circuit chip 3 includes, for example, a semiconductor substrate 20, a plurality of transistors Tr, and a plurality of wirings L. The plurality of transistors Tr are provided with portions in the semiconductor substrate 20. The wiring L connects the transistor Tr and the array chip 2.

2. Configuration of Semiconductor Substrate and Transistor

Figure 2:
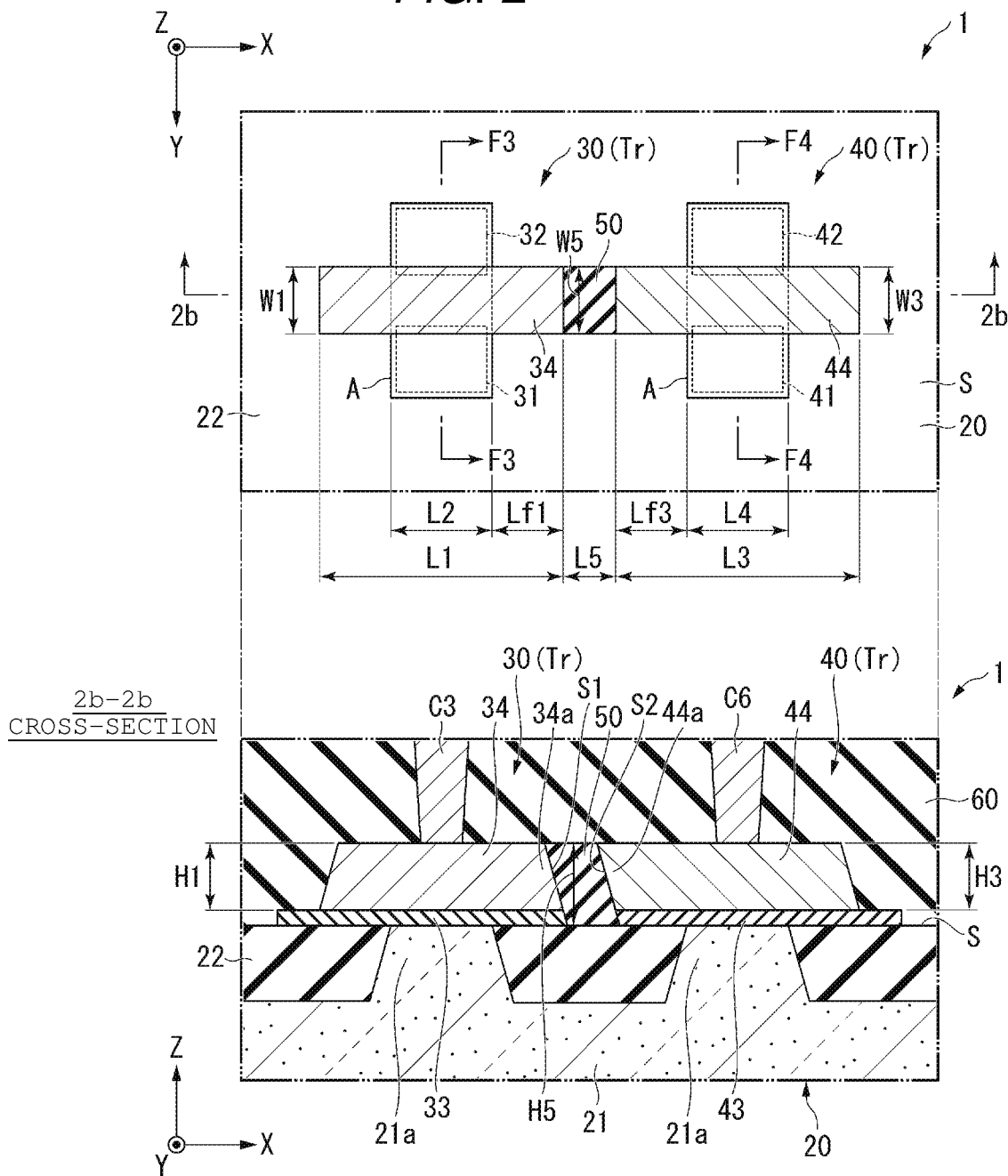
FIG. 2 depicts a semiconductor substrate and two transistors in a first embodiment.

FIG. 2 are views illustrating the semiconductor substrate 20 and two transistors Tr. In some drawings or portions thereof, insulating portions between or covering elements are omitted when not relevant to the description.

<2.1 Semiconductor Substrate>

The semiconductor substrate 20 is, for example, a silicon substrate. The semiconductor substrate 20 includes a substrate main body 21 and an element isolation portion 22. In addition, the semiconductor substrate 20 has a surface S as what may be called a frontside or an upper surface.

The substrate main body 21 is a portion that functions as a base material on which the transistors TR are provided. The substrate main body 21 may comprise a silicon material. In the substrate main body 21, a well region 21a having a polarity (conductivity type) different from that of a source region and a drain region of the transistor Tr is provided in a part of a region where at least the transistor Tr is provided.

The element isolation portion 22 is an isolation portion that electrically isolates the plurality of transistors Tr. An element isolation portion 22 surrounds an activation region A of each of the transistors Tr in the semiconductor substrate 20.

<2.2 Transistor>

The transistors Tr include a first transistor 30 and a second transistor 40. Each of the first transistor 30 and the second transistor 40 is a field effect transistor, for example, a metal oxide semiconductor field effect transistor (MOSFET). The second transistor 40 is disposed adjacent to the first transistor 30 in the X direction.

<2.2.1 First Transistor>

Figure 3:
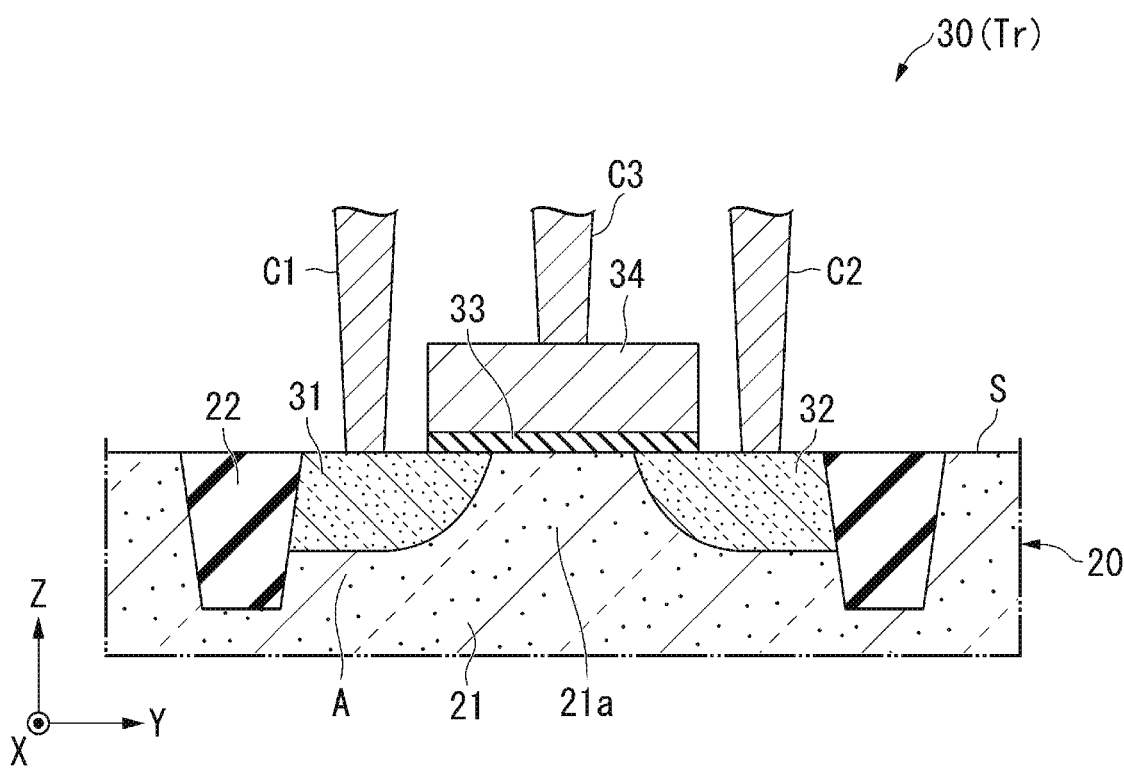
FIG. 3 is a cross-sectional view taken along line F3-F3 in FIG. 2 illustrating a first transistor.

FIG. 3 is a cross-sectional view taken along line F3-F3 (see FIG. 2) illustrating aspects of the first transistor 30. The first transistor 30 includes a source region 31, a drain region 32, a gate insulating film 33, and a gate electrode 34.

The source region 31 and the drain region 32 are provided as a part of an upper portion of the semiconductor substrate 20. The source region 31 and the drain region 32 are provided in the activation region A of the first transistor 30. The source region 31 and the drain region 32 are separated from each other in the Y direction. The source region 31 and the drain region 32 are formed by doping the semiconductor substrate 20 with an impurity (dopant). For example, each of the source region 31 and the drain region 32 includes an n-type dopant and may be referred to as an n-type semiconductor region or material. In other examples, the source region 31 and the drain region 32 may include a p-type dopant instead. The source region 31 is an example of a "first diffusion region". The drain region 32 is an example of a "second diffusion region".

A contact electrode C1 is provided above the source region 31. The contact electrode C1 is connected to the source region 31 in the Z direction. A contact electrode C2 is provided above the drain region 32. The contact electrode C2 is connected to the drain region 32 in the Z direction.

The gate insulating film 33 is positioned between the semiconductor substrate 20 and the gate electrode 34 and electrically separates the semiconductor substrate 20 and the gate electrode 34 from each other. The gate insulating film 33 is provided on the surface S of the semiconductor substrate 20. At least a part of the gate insulating film 33 faces a region (channel region) left between the source region 31 and the drain region 32 in the Z direction. The gate insulating film 33 is formed of, for example, a silicon oxide. The gate insulating film 33 is an example of a "first gate insulating film".

The gate electrode 34 is positioned opposite to the semiconductor substrate 20 with the gate insulating film 33 interposed therebetween. At least a part of the gate electrode 34 faces the channel region left between the source region 31 and the drain region 32 with the gate insulating film 33 interposed therebetween. The gate electrode 34 is formed of, for example, a doped polysilicon. The gate electrode 34 is an example of a "first gate electrode". A contact electrode C3 is provided above the gate electrode 34. The contact electrode C3 is connected to the gate electrode 34 in the Z direction.

<2.2.2 Second Transistor>

Figure 4:
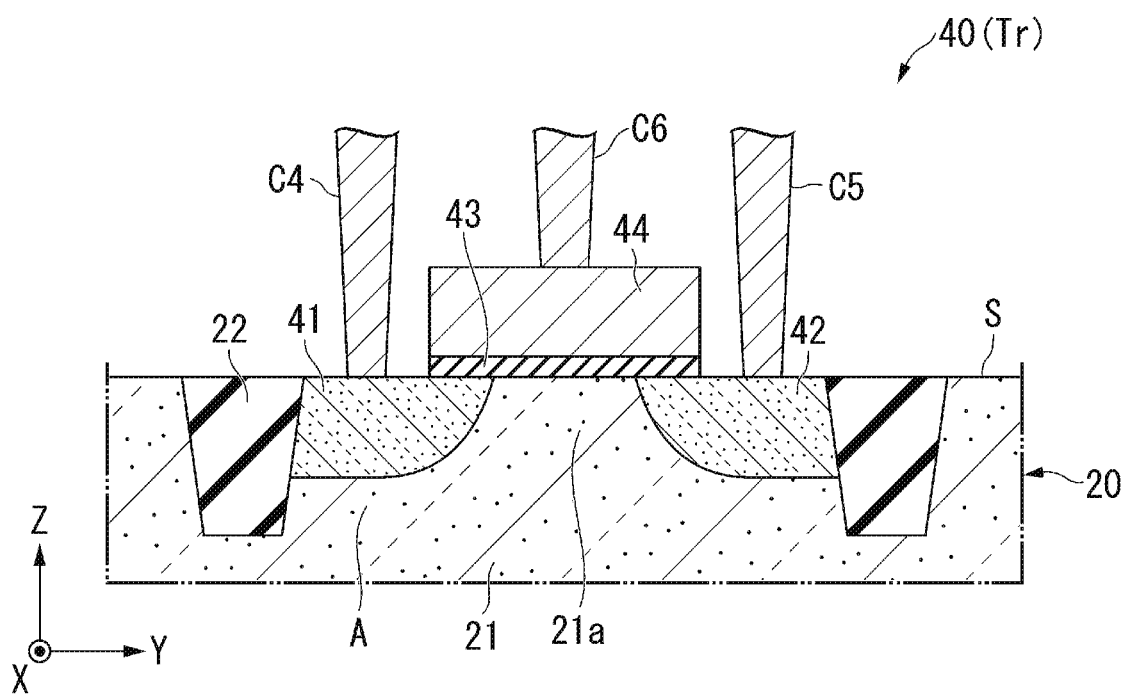
FIG. 4 is a cross-sectional view taken along line F4-F4 in FIG. 2 illustrating a second transistor.

FIG. 4 is a cross-sectional view taken along line F4-F4 (see FIG. 2) illustrating aspects of the second transistor 40. The second transistor 40 includes a source region 41, a drain region 42, a gate insulating film 43, and a gate electrode 44.

The source region 41 and the drain region 42 are provided as a part of the semiconductor substrate 20. The source region 41 and the drain region 42 are provided in an activation region A for the second transistor 40. The source region 41 and the drain region 42 are separated from each other in the Y direction. The source region 41 and the drain region 42 are formed by doping the upper portion of the semiconductor substrate 20 with an impurity. For example, each of the source region 41 and the drain region 42 includes an n-type dopant. In other examples, the source region 41 and the drain region 42 may include a p-type dopant instead. The source region 41 is an example of a "third diffusion region". The drain region 42 is an example of a "fourth diffusion region".

A contact electrode C4 is provided above the source region 41. The contact electrode C4 is connected to the source region 41 in the Z direction. A contact electrode C5 is provided above the drain region 42. The contact electrode C5 is connected to the drain region 42 in the Z direction.

The gate insulating film 43 is positioned between the semiconductor substrate 20 and the gate electrode 44 and electrically separates the semiconductor substrate 20 and the gate electrode 44 from each other. The gate insulating film 43 is provided on the surface S of the semiconductor substrate 20. At least a part of the gate insulating film 43 faces a region (channel region) left between the source region 41 and the drain region 32. The gate insulating film 43 is formed of, for example, a silicon oxide. The gate insulating film 43 is an example of a "second gate insulating film".

The gate electrode 44 is positioned opposite to the semiconductor substrate 20 with the gate insulating film 43 interposed therebetween. At least a part of the gate electrode 44 faces the channel region between the source region 41 and the drain region 42 with the gate insulating film 43 interposed therebetween. The gate electrode 44 is formed of, for example, a doped polysilicon. The gate electrode 44 is an example of a "second gate electrode". A contact electrode C6 is provided above the gate electrode 44. The contact electrode C6 is connected to the gate electrode 44 in the Z direction.

Next, referring back to FIG. 2, shapes of the gate electrode 34 and the gate electrode 44 will be described. The gate electrode 34 (of the first transistor 30) extends in the X direction beyond the activation region A of the first transistor 30. That is, a dimension L1 of the gate electrode 34 in the X direction is more than the dimension L2 of the activation region A of the first transistor 30 in the X direction. One reason why the dimension L1 is set to be more than the dimension L2 is to reduce the permeation (diffusion) of impurity into the channel region between the source region 31 and the drain region 32 from the X direction sides, when the semiconductor substrate 20 is being doped with impurity to form the source region 31 and the drain region 32. But other reasons why the dimension L1 is set to be more than the dimension L2 may also be present. Hereinafter, the length of the portion of the gate electrode 34 protruding and extending beyond the activation region A of the first transistor 30 will also be referred to as the "fringe distance Lf1".

Likewise, the gate electrode 44 of the second transistor 40 extends in the X direction further than the activation region A of the second transistor 40. That is, a dimension L3 of the gate electrode 44 in the X direction is more than the dimension L4 of the activation region A of the second transistor 40 in the X direction. One reason why the dimension L3 is set to be more than the dimension L4 is to reduce permeation of impurity into the channel region between the source region 41 and the drain region 42 from the X direction sides when the semiconductor substrate 20 is doped with impurity to form the source region 41 and the drain region 42, though other reasons may also be present. Hereinafter, the length of a portion of the gate electrode 44 protruding and extending beyond the activation region A of the second transistor 40 will also be referred to as the "fringe distance Lf3".

In the first embodiment, the gate electrode 34 and the gate electrode 44 face each other in the X direction. The distance L5 between the gate electrode 34 and the gate electrode 44 is, for example, less than the dimension L2 and less than the dimension L4.

<2.3 First Insulating Portion>

The semiconductor device 1 includes a first insulating portion 50. The first insulating portion 50 is an insulating material that is disposed between the gate electrode 34 and the gate electrode 44 and electrically insulates the gate electrode 34 and the gate electrode 44 from each other. The first insulating portion 50 is provided along the X direction from the gate electrode 34 edge (side surface) to the gate electrode 44 edge (side surface). The width W5 of the first insulating portion 50 in the Y direction is greater than or equal to the width W1 of the gate electrode 34 in the Y direction and also greater than or equal to the width W3 of the gate electrode 44 in the Y direction. In addition, a thickness H5 of the first insulating portion 50 in the Z direction is greater than or equal to the thickness H1 of the gate electrode 34 in the Z direction and is more than or equal to the thickness H3 of the gate electrode 44 in the Z direction. The width W5 is less than the dimension L2 and is also less than the dimension L4.

The first insulating portion 50 is formed of, for example, a silicon oxide ($SiO_2$) For example, the first insulating portion 50 is formed of a silicon oxide not including hydrogen. The first insulating portion 50 is formed of a material different from that of a second insulating portion 60. For example, the material of the first insulating portion 50 has a lower dielectric constant than the material of the second insulating portion 60.

Here, the gate electrode 34 has a first side portion 34a on the side facing the gate electrode 44. In the embodiment, the first side portion 34a has a forward tapered first slope S1. In other words, the first slope S1 is tilted in a direction in which the dimension of the gate electrode 34 in the X direction increases as the semiconductor substrate 20 gets nearer. That is, in the XZ plane cross-section the first slope S1 angles inwardly from the bottom of the gate electrode 34 towards the top. The gate electrode 34 in some examples may thus have a trapezoidal shape in the XZ plane cross-section as depicted in FIG. 2.

The first insulating portion 50 covers the first side portion 34a along the first slope S1. In the embodiment, the side of the first insulating portion 50 contacting the first side portion 34a is thus inclined at a supplementary angle with respect to the first slope S1.

<2.4 Second Insulating Portion>

The semiconductor device 1 includes the second insulating portion 60. The second insulating portion 60 covers the first transistor 30, the second transistor 40, and the first insulating portion 50 on the semiconductor substrate 20. The second insulating portion 60 is an insulating material that is between the wiring L (refer to FIG. 1) and the first and second transistors 30 and 40. The second insulating portion 60 electrically primarily insulates the first and second transistors 30 and 40 from the wiring L, but may also be between various elements in the X and Y directions. In the present example, the second insulating portion 60 integrally covers the first transistor 30, the second transistor 40, and the first insulating portion 50 from above, and is also disposed surrounding the group of elements including the first transistor 30, the second transistor 40, and the first insulating portion 50 in the XXY plane. In the second insulating portion 60, the contact electrodes C1, C2, C3, C4, C5, and C6 extend in the Z direction.

The second insulating portion 60 is a deposition film that is formed through a film deposition process using a gas. The second insulating portion 60 is formed of, for example, a silicon nitride (SiN) or tetraethyl orthosilicate (TEOS; $Si(OC_2H_5)_4$).

In the present embodiment, the gate electrode 44 has a second side portion 44a facing the gate electrode 34. This second side portion 44a has a reverse tapered second slope S2. The second slope S2 is inclined along the first insulating portion 50. The second slope S2 slopes in the same direction as that of the first slope S1. The second slope S2 is thus at a supplementary angle of first slope S1 in this example with respect to the XY plane. In the XZ plane cross-section the second slope S2 angles outwardly from the bottom of the gate electrode 34 towards the top. The gate electrode 44 in some examples may thus have a rhomboidal shape in the XZ plane cross-section as depicted in FIG. 2.

3. Method of Manufacturing Semiconductor Device

The manufacturing aspects relating to formation of the first transistor 30, the second transistor 40, and the first insulating portion 50 will be primarily described. Regarding other aspects related to manufacturing other components in the semiconductor device 1, in general, well-known methods may be adopted.

FIGS. 5A to 5I are diagrams illustrating a method of manufacturing the semiconductor device 1. Each of FIGS. 5A to 5I incorporates a plan view in an upper page portion and a corresponding cross-section view in a lower page portion, which unless otherwise noted can be assumed to be taken at the centerline/midpoint of the plan view portion along the Y direction (up-down page direction) dimension of the plan view (compare cross-sectional line 2b-2b in FIG. 2).

First, as illustrated in FIG. 5A, the element isolation portion 22 is provided on the semiconductor substrate 20. Next, an insulating film 71 for forming the gate insulating film 33 of the first transistor 30 is formed on the surface S of the semiconductor substrate 20. For example, the insulating film 71 is a silicon oxide film. The insulating film 71 is formed in a region where the first transistor 30 is provided and a region where the second transistor 40 is provided. The insulating film 71 is an example of a "first insulating film".

Next, a conductive film 72 for forming the gate electrode 34 of the first transistor 30 is formed on the insulating film 71. The conductive film 72 is formed by doping a semiconductor layer formed of a polysilicon with impurity. The conductive film 72 is formed in the region where the first transistor 30 is provided and the region where the second transistor 40 is provided. The conductive film 72 is an example of a "first conductive film".

Next, as illustrated in FIG. 5B, the insulating film 71 and the conductive film 72 are removed in the region where the second transistor 40 is provided. The removal of the insulating film 71 and the conductive film 72 is performed, for example, by wet etching. In this removal process, for example, due to the processing by the wet etching, the forward tapered first slope S1 is formed on a side portion 72a of the conductive film 72 positioned close to the side where the second transistor 40 is provided.

Next, as illustrated in FIG. 5C, an insulating film 81 for forming the first insulating portion 50 is formed. For example, the insulating film 81 is provided by forming a silicon oxide film on the conductive film 72 and the surface S of the semiconductor substrate 20. The insulating film 81 is formed in a region where the first transistor 30 is provided and a region where the second transistor 40 is provided. A part of the insulating film 81 is formed along the first slope S1 of the side portion 72a of the conductive film 72. The insulating film 81 is an example of a "second insulating film".

Next, as illustrated in FIG. 5D, unnecessary portions of the insulating film 81 are removed. For example, the portion of the insulating film 81 positioned above the conductive film 72 and the portion positioned in the region where the second transistor 40 is provided are removed. The removal of the unnecessary portions of the insulating film 81 is performed, for example, by wet etching. The step of removing the unnecessary portions of the insulating film 81 may include processing by chemical mechanical polishing (CMP). After the processing, only the portion of the original insulating film 81 along the first slope S1 of the side portion 72a remains.

Next, as illustrated in FIG. 5E, an insulating film 91 for forming the gate insulating film 43 of the second transistor 40 is formed on the conductive film 72, on the insulating film 81, and on the surface S of the semiconductor substrate 20. For example, the insulating film 91 is provided by forming a silicon oxide film on the conductive film 72, on the insulating film 81, and on the surface S of the semiconductor substrate 20. The insulating film 91 is formed in a region where the first transistor 30 is provided and a region where the second transistor 40 is provided. The insulating film 91 is an example of a "third insulating film".

Next, unnecessary portions of the insulating film 91 are removed. For example, in the insulating film 91, the portion of the insulating film 91 above the conductive film 72 and the portion positioned above the insulating film 81 are removed. The removal of the unnecessary portions of the insulating film 91 is performed, for example, by wet etching.

Next, as illustrated in FIG. 5F, a conductive film 92 for forming the gate electrode 44 of the second transistor 40 is formed on the conductive film 72, on the insulating film 81, and on the insulating film 91. The conductive film 92 is formed by doping a semiconductor layer formed of a polysilicon with impurity. The conductive film 92 is formed in the region where the first transistor 30 is provided and the region where the second transistor 40 is provided. In this process, the second slope S2 along the inclined insulating film 81 is formed in a part of the conductive film 92. The conductive film 92 is an example of a "second conductive film".

Next, as illustrated in FIG. 5G, unnecessary portions of the conductive film 92 are removed. For example, the portion of the insulating film 91 positioned above the conductive film 72 and the portion positioned above the insulating film 81 are removed. The removal of the unnecessary portions of the conductive film 92 is performed, for example, by wet etching. The step of removing the unnecessary portion of the conductive film 92 may include processing by CMP. As a result, the conductive film 92 remains only in the region where the second transistor 40 is provided.

Next, as illustrated in FIG. 5H, a mask M is provided on the conductive film 92, the insulating film 81, and the conductive film 72. The mask M has a shape corresponding to the gate electrode 34, the first insulating portion 50, and the gate electrode 44. The remaining unnecessary portions of the conductive film 72, the insulating film 81, and the conductive film 92 are removed while using the mask M to protect the necessary portions. The removal of these remaining unnecessary portions is performed, for example, by wet etching.

Figure 5I:
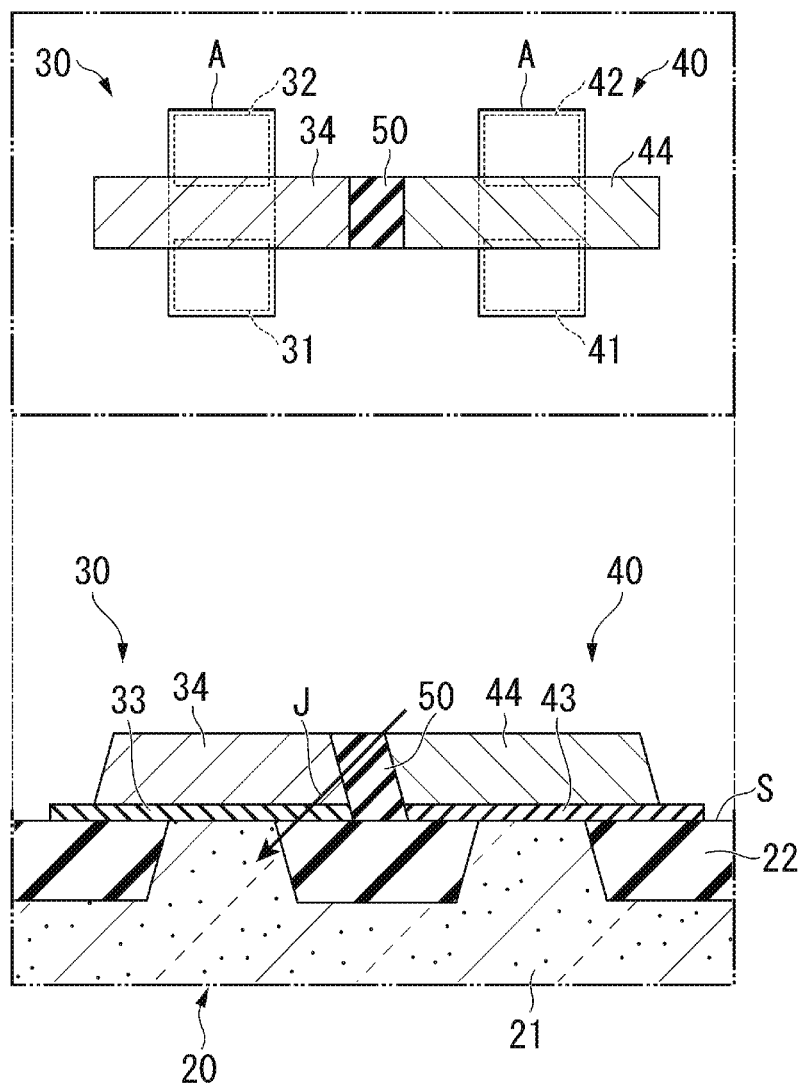

As a result, as illustrated in FIG. 5I, the gate electrode 34 is formed from the originally deposited conductive film 72, the first insulating portion 50 is formed from the originally deposited insulating film 81, and the gate electrode 44 is formed from the originally deposited conductive film 92. By doping the upper portion of the semiconductor substrate 20 with impurity by ion implantation, the source region 31 and the drain region 32 of the first transistor 30 and the source region 41 and the drain region 42 of the second transistor 40 are formed.

An arrow J depicted in FIG. 5I indicates an example of an implantation direction for the implanted impurity. This impurity implantation can be used to provide a lightly doped drain (LDD) structure. In the present embodiment, the impurity is implanted from a direction oblique to the gate electrode 34 or the gate electrode 44. At least a part of the impurity is implanted into the semiconductor substrate 20 by passing through the first insulating portion 50 and the gate electrode 34 (or the gate electrode 44).

The gate insulating film 33 is formed from the insulating film 71, and the gate insulating film 43 is formed from the insulating film 91.

Next, an insulator material for forming the second insulating portion 60 is formed over the first transistor 30, the first insulating portion 50, and the second transistor 40. The second insulating portion 60 is formed, for example, using a method of depositing an insulating material from a gas. At this point, the manufacturing steps relating to the first transistor 30, the second transistor 40, and the like are completed.

4. Advantageous Effects

As a comparative example, a case where the gate electrode 34 of the first transistor 30 and the gate electrode 44 of the second transistor 40 are formed by processing a single gate electrode material will be described. In such a case, a process of forming an opening above the gate electrode material by lithography and then cutting (removing) the portion of the gate electrode material exposed by the opening to form the single gate electrode material into the gate electrode 34 of the first transistor 30 and the gate electrode 44 of the second transistor 40 is required. When such a process is used, a margin is required to be left between the activation region A of the first transistor 30 and the activation region A of the second transistor 40 in consideration of an exposure resolution limit of the lithography, alignment/positioning errors, a processing error in formation of the opening, a processing tolerance in the removal of the gate electrode material, and the like, and it may be difficult to improve the integration degree of such a semiconductor device in view of the required margin(s) (minimum practical distances in view of normal process variations, limitations, acceptable design tolerances, and the like).

In addition, in the comparative example described above, when the single gate electrode material is "cut" into the gate electrode 34 and the gate electrode 44 an unfilled space is left is initially between the gate electrode 34 and the gate electrode 44 by the gate electrode material removal process. However, for forming the LDD structure is impurity is implanted from a direction oblique to the semiconductor substrate 20, thus part of the implanted impurities pass through this "cut" space left between the gate electrode 34 and the gate electrode 44. Some portion the impurities passing through this space in the implantation process will beat a high velocity, the space will be generally ineffective at slowing or stopping such impurities and thus impurities might be undesirably implanted into the semiconductor substrate 20 and reach the region (channel region) between the source region 31 and the drain region 32 (or between the source region 41 and the drain region 42). When impurity being implanted into the semiconductor substrate 20 reaches the channel region between the source region 31 and the drain region 32 (or between the source region 41 and the drain region 42), electrical characteristics of the first transistor 30 or the second transistor 40 may deteriorate. Accordingly, in the comparative example, the distances (for example, the fringe distances Lf1 and Lf3 illustrated in FIG. 2) by which the gate electrode 34 and the gate electrode 44 protrude from the activation region A need to be designed/set to be larger such that the impurity being implanted into the semiconductor substrate 20 does not reach the region between the source region 31 and the drain region 32 (or between the source region 41 and the drain region 42). From this viewpoint, with the structure of the comparative example, it may be difficult to improve the integration degree (miniaturization) of the semiconductor device.

On the other hand, in the first embodiment, the semiconductor device 1 includes the first insulating portion 50 that is positioned between the gate electrode 34 and the gate electrode 44. The second insulating portion 60 covers the first transistor 30, the second transistor 40, and the first insulating portion 50. The first insulating portion 50 and the second insulating portion 60 can be formed of different materials. With this configuration, the insulation structure between the gate electrode 34 and the gate electrode 44 can be without a lithographic cut process or the like. Therefore, the formation of a small opening using lithography does not need to be performed. As a result, the margin required to be left between the activation region A of the first transistor 30 and the activation region A of the second transistor 40 can be reduced since the lithographic resolution and associated process tolerances are not a direct concern as they would otherwise be in a "cut" process. As a result, the activation region A of the first transistor 30 and the activation region A of the second transistor 40 can be disposed closer to each other, and the integration degree of the semiconductor device 1 can be improved as compared to the comparative example.

In addition, in the embodiment, the first insulating portion 50 is present between the gate electrode 34 and the gate electrode 44. Therefore, for example, a part of the impurity for forming the LDD structure passes through the first insulating portion 50 (rather than unfilled space) such that the impurity passes through the gate electrode 34 or the gate electrode 44 at a reduced velocity and is thus likely to reach into the channel region when implanted into the semiconductor substrate 20. Therefore, even when the fringe distances Lf1 and Lf3 (illustrated in FIG. 2) at which the gate electrode 34 and the gate electrode 44 protrude from the activation region A are kept small, the possibility that a part of the impurity implanted into the semiconductor substrate 20 may reach the channel region between the source region 31 and the drain region 32 (or between the source region 41 and the drain region 42) can be reduced. From this viewpoint, as compared to the structure of the comparative example, the activation region A of the first transistor 30 and the activation region A of the second transistor 40 can be disposed closer to each other, and the integration degree of the semiconductor device 1 can be improved.

In an embodiment, the material of the first insulating portion 50 has a lower dielectric constant than the material of the second insulating portion 60. With this configuration, insulating properties (voltage resistance) between the gate electrode 34 and the gate electrode 44 can be improved.

Modification Example

In a first embodiment, the gate electrode 34 has the forward tapered first slope S1, the first insulating portion 50 is an insulating film formed along the first slope S1, and the gate electrode 44 has the second slope S2 formed along the first insulating portion 50. However, instead of this configuration, the first side portion 34a of the gate electrode 34 may have an end surface along a substantially vertical direction. In this case, the first insulating portion 50 is formed in a cuboidal shape along the vertical direction. In addition, the second side portion 44a of the gate electrode 44 may have an end surface along a substantially vertical direction. This modification example may also be implemented in combination with other embodiments, such as the second embodiment or the third embodiment described below.

Second Embodiment

The second embodiment is different from the first embodiment in a method of manufacturing a first insulating portion 50A. Aspects other than those described below can be considered the same as in the first embodiment.

FIG. 6 provides views illustrating the semiconductor substrate 20 and two transistors Tr in a semiconductor device 1A according to the second embodiment. The semiconductor device 1A includes a second transistor 40A instead of the second transistor 40. The second transistor 40A includes a gate insulating film 43A. The semiconductor device 1A also includes a first insulating portion 50A instead of the first insulating portion 50. In the second embodiment, the first insulating portion 50A and the gate insulating film 43A of the second transistor 40A are integrally formed.

FIGS. 7A to 7D are diagrams illustrating a method of manufacturing the semiconductor device 1A. Each of FIGS. 7A to 7D incorporates a plan view in an upper page portion and a corresponding cross-section view in a lower page portion, which unless otherwise noted can be assumed to be taken at the centerline/midpoint of the plan view portion along the Y direction (up-down page direction) dimension of the plan view (compare cross-sectional line 2b-2b in FIG. 2

The steps up to FIG. 7A are the same as the steps up to FIG. 5B in the first embodiment. Next, as illustrated in FIG. 7B, an oxidizer is supplied to the conductive film 72 and the surface S of the semiconductor substrate 20, and a surface layer part of the conductive film 72 and a surface layer part of the semiconductor substrate 20 are oxidized. As a result, an insulating film 101 is formed. The insulating film 101 includes: a first portion 101a formed on the conductive film 72; a second portion 101b formed along the first slope S1 of the side portion 72a of the conductive film 72; and a third portion 101c formed on the surface S of the semiconductor substrate 20. In the second embodiment, the second portion 101b of the insulating film 101 is an example of a "second insulating film". The third portion 101c of the insulating film 101 is an example of a "third insulating film".

FIG. 7B illustrates a case where the additional insulating film 101 is provided on the conductive film 72 and the semiconductor substrate 20. However, this illustration is for convenience of description. Actually, the insulating film 101 is formed by oxidizing the surface layer part of the conductive film 72 and the surface layer part of the semiconductor substrate 20 to change the original composition. That is, the oxidation converts portions of the original materials into the insulating film 101. Instead of this, in other examples, an insulating material for forming the insulating film 101 may be supplied to cover the conductive film 72 and the semiconductor substrate 20.

Next, as illustrated in FIG. 7C, unnecessary portions of the insulating film 101 can be removed. The conductive film 92 for forming the gate electrode 44 is formed on the conductive film 72 and on the insulating film 101. This step can be substantially the same as the aspects of the first embodiment described with reference to FIG. 5F.

Next, as illustrated in FIG. 7D, unnecessary portions of the conductive film 92 are removed. This step can be substantially the same as the aspects of the first embodiment described with reference to FIG. 5G. Next, a mask M the same or substantially to similar to that of the first embodiment is provided, and remaining unnecessary portions of the conductive film 72, the insulating film 101, and the conductive film 92 are removed. As a result, the first insulating portion 50A is formed from the second portion 101b of the insulating film 101. In addition, the gate insulating film 43A is formed from the third portion 101c of the insulating film 101.

The semiconductor device 1A can have an improved integration degree in a manner similar to that of the first embodiment.

Third Embodiment

The third embodiment is different from the first embodiment in that the gate electrode 34 and the gate electrode 44 have different polarities (conductivity types). Aspects other than those described below are the same as the first embodiment.

Figure 8:
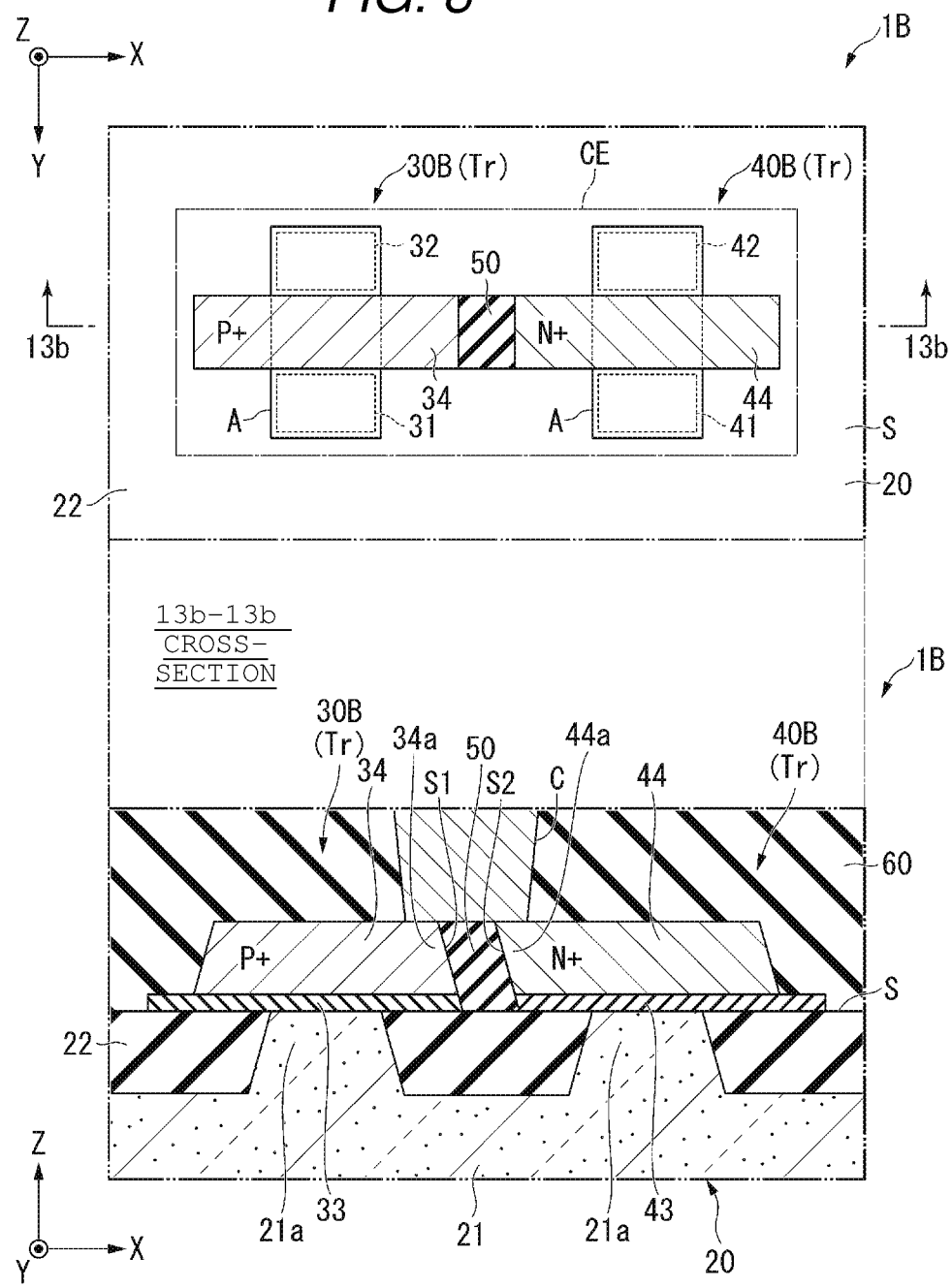
FIG. 8 illustrates a semiconductor substrate and two transistors in a third embodiment.

FIG. 8 provides views illustrating the semiconductor substrate 20 and two transistors Tr in a semiconductor device 1B according to the third embodiment. The semiconductor device 1B includes a first transistor 30B and a second transistor 40B instead of the first transistor 30 and the second transistor 40.

In the third embodiment, the gate electrode 34 of the first transistor 30B and the gate electrode 44 of the second transistor 40B have different polarities (different conductivity types). The gate electrode 34 of the first transistor 30B has a first polarity. For example, the gate electrode 34 of the first transistor 30B comprises a $P^+$ type semiconductor material. The gate electrode 44 of the second transistor 40B has a second polarity different from the first polarity. For example, the gate electrode 44 of the second transistor 40B comprises an $N^+$ type semiconductor material.

In the third embodiment, a contact electrode C spanning between the gate electrode 34 and the gate electrode 44 is provided instead of the contact electrode C3 and the contact electrode C6. For example, the contact electrode C is provided above a part of the gate electrode 34, a part of the gate electrode 44, and the first insulating portion 50. The contact electrode C is electrically connected to both the gate electrode 34 and the gate electrode 44 in the Z direction.

The semiconductor device 1B comprises a logic circuit including the first transistor 30B and the second transistor 40B. The first transistor 30B and the second transistor 40B form a part of a basic logical element CE (for example, a NOT circuit) in the logic circuit as one inverter structure or the like.

In the configuration, the first insulating portion 50 is present between the gate electrode 34 and the gate electrode 44 having different polarities. Therefore, interdiffusion of impurity between the gate electrode 34 and the gate electrode 44 is reduced. As a result, a fluctuation in electrical characteristics between the first transistor 30B and the second transistor 40B can be reduced, and the performance of the semiconductor device 1B can be improved.

The described examples are non-limiting with respect to the scope of the present disclosure. Two or more of the described embodiments may be combined and implemented together. For example, the second embodiment and the third embodiment may be combined.

In at least one of the embodiments described above, the semiconductor device includes: a first insulating portion that is positioned between a gate electrode of a first transistor and a gate electrode of a second transistor; and a second insulating portion that covers the first transistor, the second transistor, and the first insulating portion from a side opposite to a semiconductor substrate. The first insulating portion and the second insulating portion are formed of different materials. With this configuration, the integration can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first transistor having a first diffusion region and a second diffusion region in a substrate, a first gate insulating film on a first channel region between the first diffusion region and the second diffusion region, and a first gate electrode on the first gate insulating film;
a second transistor adjacent to the first transistor and having a third diffusion region and a fourth diffusion region in the substrate, a second gate insulating film on a second channel region between the third diffusion region and the fourth diffusion region, and a second gate electrode on the second gate insulating film;
a first insulating portion between the first gate electrode and the second gate electrode; and
a second insulating portion covering the first transistor, the second transistor, and the first insulating portion, wherein
the first insulating portion and the second insulating portion are different materials, and
the first insulating portion directly contacts a sidewall of the first gate electrode and a sidewall of the second gate electrode.

2. The semiconductor device according to claim 1, wherein
the sidewall of the first gate electrode is sloped away from the second gate electrode, and
the sidewall of the second gate electrode is sloped towards the first gate electrode.

3. The semiconductor device according to claim 2, wherein the first and second gate electrodes are the same thickness in a direction orthogonal to the substrate.

4. The semiconductor device according to claim 2, wherein the first insulating portion has a lower dielectric constant than the second insulating portion.

5. The semiconductor device according to claim 1, wherein
the second gate insulating film and the first insulating portion are the same material, and
the first and second gate insulating films are different materials.

6. The semiconductor device according to claim 1, wherein an electrical contact portion extends through the second insulating portion and contacts upper surfaces of the first insulating portion, the first gate electrode, and the second gate electrode.

7. The semiconductor device according to claim 1, wherein
a first electrical contact portion extends through the second insulating portion and contacts an upper surface of the first gate electrode, and
a second electrical contact portion extends through the second insulating portion and contacts an upper surface of the second gate electrode.

8. The semiconductor device according to claim 1, wherein the first gate insulating film extends beyond an outer edge of the first gate electrode on a side opposite from the second gate electrode.

9. The semiconductor device according to claim 1, wherein the second gate insulating film extends beyond an outer edge of the second gate electrode on a side opposite from the first gate electrode.

10. The semiconductor device according to claim 1, wherein the first insulating portion comprises a silicon oxide.

11. The semiconductor device according to claim 1, wherein
the first gate electrode has a first side portion facing the second gate electrode,
the first side portion has a first slope that is inclined away from the second gate electrode,
the first insulating portion contacts the first slope,
the second gate electrode includes a second side portion facing the first gate electrode,
the second side portion has a second slope inclined towards the first gate electrodes, and
the first insulating portion contacts the second slope.

12. The semiconductor device according to claim 1, wherein
the first gate electrode is a first polarity type semiconductor material,
the second gate electrode is a second polarity type semiconductor material different from the first polarity type semiconductor material, and
an electrical contact portion extends through the second insulating portion and contacts upper surfaces of the first insulating portion, the first gate electrode, and the second gate electrode.

13. A semiconductor device, comprising:
a first active region of a substrate including a first diffusion region, a second diffusion region, and a first channel region between the first and second diffusion regions in a first direction;
a second active region of the substrate including a third diffusion region, a fourth diffusion region, and a second channel region between the third and fourth diffusion regions in the first direction;
an isolation element between the first active region and the second active region in a second direction crossing the first direction;
a first gate insulating film on the substrate above the first channel region;
a second gate insulating film on the substrate above the second channel region in a third direction;
a first gate electrode on the first gate insulating film above the first channel region in the third direction;
a second gate electrode on the second gate insulating film above the second channel region in the third direction;
a first insulating material between the first gate electrode and the second gate electrode in the second direction; and
a second insulating material covering the first gate electrode, the first insulating material, and the second gate electrode, wherein
the first and second insulating materials are different materials, and
the first insulating material directly contacts a sidewall of the first gate electrode, a sidewall of the second gate electrode, and an upper surface of the isolation element.

14. The semiconductor device according to claim 13, wherein
the second gate insulating film is the same material as the first insulating material, and
the first gate insulating film is a different material from the second gate insulating film.

15. The semiconductor device according to claim 13, wherein
the first gate electrode has a trapezoidal cross-sectional shape, and
the second gate electrode has a rhomboidal cross-sectional shape.

16. The semiconductor device according to claim 13, wherein an upper surface of the first insulating material is the same height as the upper surfaces of the first and second gate electrodes.

17. A method of manufacturing a semiconductor device, the method comprising:
- forming a first insulating film on a substrate;
- forming a first conductive film on a part of the first insulating film;
- forming a second insulating film along a side portion of the first conductive film;
- forming a second conductive film to cover the first conductive film and the second insulating film;
- forming a gate electrode of a first transistor from the first conductive film;
- forming a gate electrode of a second transistor from the second conductive film; and
- forming a third insulating film on the substrate after forming the second insulating film; and
- forming a gate insulating film of the second transistor from the third insulating film.

\* \* \* \* \*